United States Patent
Reinmuth et al.

(10) Patent No.: US 11,978,658 B2
(45) Date of Patent: May 7, 2024

(54) METHOD FOR MANUFACTURING A POLYSILICON SOI SUBSTRATE INCLUDING A CAVITY

(71) Applicant: Robert Bosch GmbH, Stuttgart (DE)

(72) Inventors: Jochen Reinmuth, Reutlingen (DE); Peter Schmollngruber, Aidlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 17/456,030

(22) Filed: Nov. 22, 2021

(65) Prior Publication Data

US 2022/0172981 A1 Jun. 2, 2022

(30) Foreign Application Priority Data

Nov. 27, 2020 (DE) .......................... 102020214925.9

(51) Int. Cl.
*H01L 21/762* (2006.01)
*B81B 3/00* (2006.01)
*B81C 1/00* (2006.01)
*H01L 21/02* (2006.01)

(52) U.S. Cl.
CPC ........ *H01L 21/7624* (2013.01); *B81B 3/0021* (2013.01); *B81C 1/00182* (2013.01); *H01L 21/02532* (2013.01); *H01L 21/02595* (2013.01)

(58) Field of Classification Search
CPC ........... H01L 21/7624; H01L 21/02532; H01L 21/02595; B81B 3/0021; B81C 1/00182
See application file for complete search history.

(56) References Cited

U.S. PATENT DOCUMENTS

| | | | |
|---|---|---|---|
| 8,802,473 B1* | 8/2014 | Chu | B81B 7/02 |
| | | | 438/50 |
| 10,430,631 B2 | 10/2019 | Lu et al. | |
| 2006/0226114 A1 | 10/2006 | Fischer et al. | |
| 2011/0079081 A1* | 4/2011 | Weiss | G01P 1/023 |
| | | | 216/17 |
| 2012/0038372 A1* | 2/2012 | Reinmuth | G01P 15/0802 |
| | | | 324/661 |
| 2017/0245035 A1* | 8/2017 | Lee | H01L 23/481 |

FOREIGN PATENT DOCUMENTS

JP 2011017693 A 1/2011

* cited by examiner

*Primary Examiner* — Julia Slutsker
(74) *Attorney, Agent, or Firm* — NORTON ROSE FULBRIGHT US LLP

(57) ABSTRACT

A method for manufacturing a polysilicon SOI substrate including a cavity. The method includes: providing a silicon substrate including a sacrificial layer thereon; producing a first polysilicon layer on the sacrificial layer; depositing a structuring layer on the first polysilicon layer; introducing trenches through the structuring layer, the first polysilicon layer, and the sacrificial layer up to the silicon substrate; producing a cavity in the silicon substrate by etching, an etching medium being conducted thereto through the trenches; producing a second polysilicon layer on the first polysilicon layer, the trenches being thereby closed. A micromechanical device is also described.

9 Claims, 10 Drawing Sheets

FIG. 1A
RELATED ART
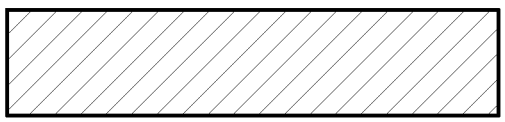
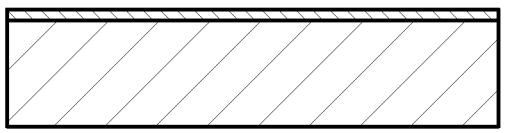
FIG. 1B
RELATED ART
FIG. 1C
RELATED ART
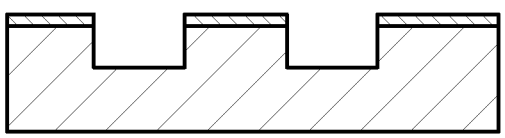
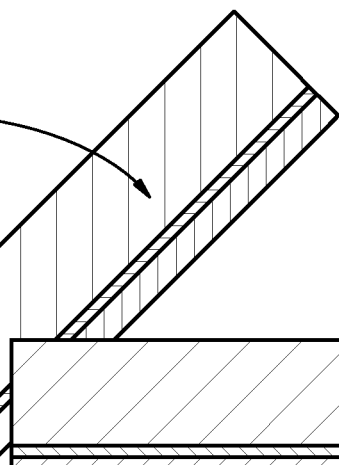
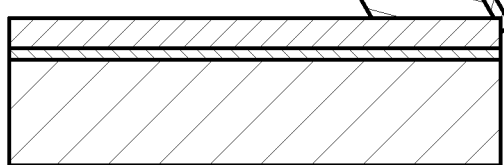
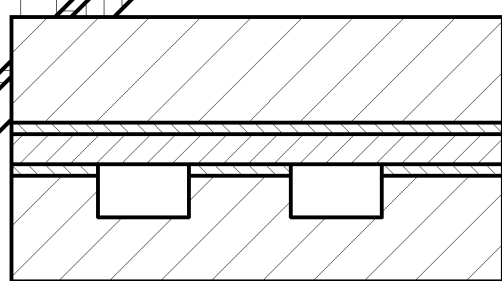
FIG. 1D
RELATED ART

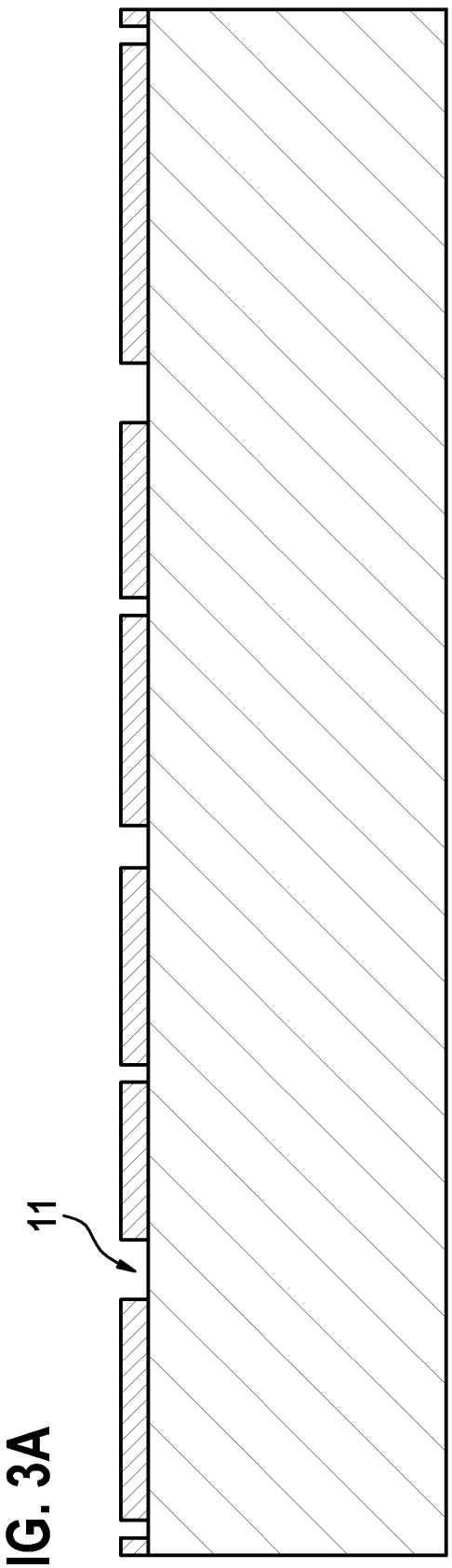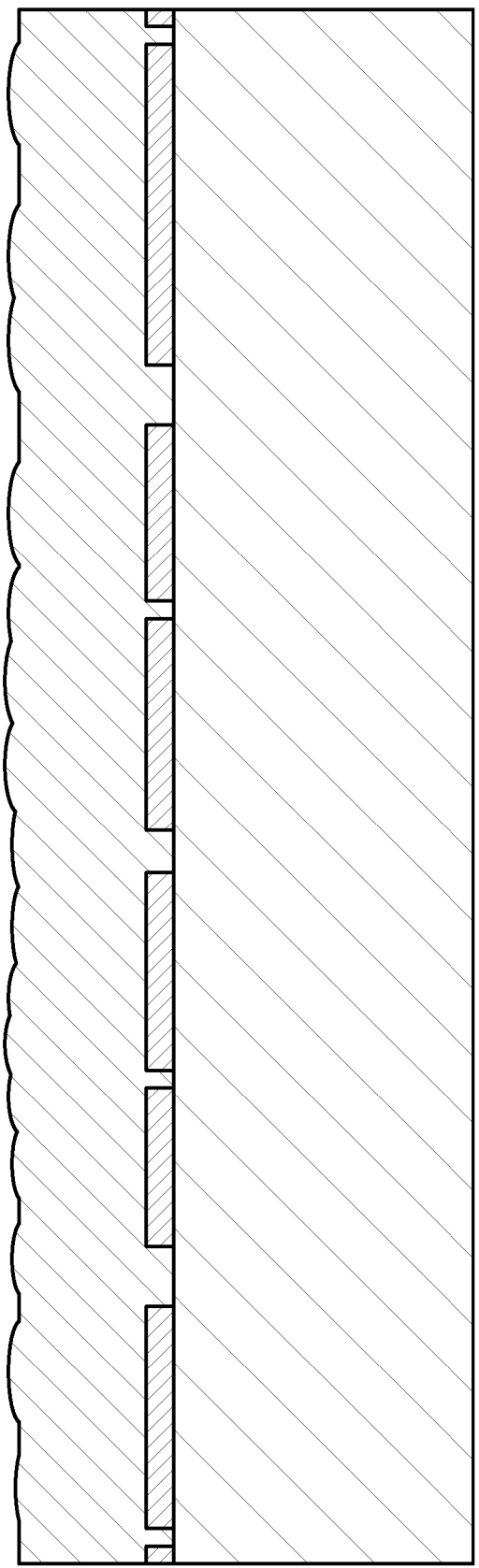

METHOD FOR MANUFACTURING A POLYSILICON SOI SUBSTRATE INCLUDING A CAVITY

BACKGROUND INFORMATION

Cavity SOI substrates (for example, substrates from Okmetic) are available, which are used as the basis for many MEMS components (FIG. 1G).

SOI substrates (SOI: silicon on insulator) include a thin monocrystalline silicon layer 3 on a substrate 1, usually on a silicon wafer, which has a very precisely defined thickness (typically 0.5-50 μm) and which is connected to the substrate via a dielectric layer 2, usually an oxide layer (typically 0.1-5 μm). Both properties, the defined thickness and the insulation layer, are very important for MEMS applications.

In cavity SOI substrates, cavities 4 are additionally provided below the thin silicon layer. Freestanding structures may be generated very easily in the thin silicon layer via a trenching process in these areas. The well-defined layer thickness is important to be able to generate structures having well-defined mechanical properties.

If cavity SOI substrates are used, sacrificial layer etching does not have to be carried out as in other processes to generate movable structures. The structures are exposed directly after the trenching process in areas under which cavities are located. In areas under which a cavity is not located, the structures are automatically mechanically coupled to the substrate. The attachment takes place via the oxide layer; that means the structures are thus automatically electrically isolated from the substrate. This is advantageous and important if a different electrical potential is to be applied between the structures.

Further functional layers, which may be protected easily in the trenching step via a resist, may also be applied to the thin silicon layer before the trenching process using simple, planar process steps. Since no subsequent sacrificial layer etching is necessary, nearly any further functional layers may be applied to the movable thin silicon layer. Since it is a wafer process, the MEMS structures thus generated may be protected very well using a cap wafer via a bonding process. To manufacture MEMS elements which are very well defined mechanically, it is important that the thickness of the thin functional layer is defined very precisely.

The manufacturing process for cavity SOI wafers is complex. Typically, an oxide layer is grown on a first wafer (FIG. 1A). A second wafer is bonded on the first wafer using a relatively costly and complex direct bonding method (FIG. 1B). The second wafer is thinned to the desired target thickness of the later thin silicon layer. An oxide layer is grown on a third wafer. The oxide layer is removed at defined areas and a depression is etched into the third substrate (FIG. 1C). The wafer stack made up of first and second wafer is bonded on the third wafer via a further direct bonding method (FIG. 1D). A part of the first wafer is then first removed using a suitable mechanical method (FIG. 1E). Since cavities are located below the first wafer, the first wafer deflects during the mechanical removal and a thicker layer 10 remains above the cavities after the removal. In a next step, the material of the first wafer is removed completely down to the first oxide layer using a slow and costly, but selective etching method (FIG. 1F).

Furthermore, the oxide layer is removed (FIG. 1G). A special wafer edge treatment is usually also not even required to make the sharp wafer edge after the grinding process somewhat more favorable.

This manufacturing method has the disadvantage that this method is very complex. Two costly and complex direct bonding steps are also necessary to be able to achieve a precisely defined layer thickness above the cavity.

Furthermore, cavity SOI wafers are very sensitive. Edges arise at the wafer edge due to the direct bonding method, which may easily result in wafer breakage if they strike lightly against an obstacle in the manufacturing process.

SUMMARY

It is an object of the present invention to provide an alternative manufacturing method for manufacturing a polysilicon SOI substrate including a cavity, which is cost effective and results in a robust product.

The present invention relates to a method for manufacturing a polysilicon SOI substrate including a cavity. In accordance with an example embodiment of the present invention, the method includes the following steps:

A: providing a silicon substrate including a sacrificial layer thereon;

B: producing a first polysilicon layer on the sacrificial layer;

C: depositing a structuring layer on the first polysilicon layer;

D: introducing trenches through the structuring layer, the first polysilicon layer, and the sacrificial layer up to the silicon substrate;

G: producing a cavity in the silicon substrate by etching, an etching medium being conducted thereto through the trenches;

H: producing a second polysilicon layer on the first polysilicon layer, the trenches being thereby closed.

In one advantageous embodiment of the present invention, it is provided that a first thin polysilicon layer is grown on a wafer including an oxide layer and subsequently a cavity is generated via an etching method below this silicon layer. Subsequently, the etching accesses in the first thin polysilicon layer are closed using a further layer deposition, preferably using a deposition of polysilicon.

As a result, a polysilicon SOI substrate including a cavity is created, which is to be manufactured easily and inexpensively. The SOI substrate manufactured according to the present invention provides a thin silicon layer having a very precisely defined thickness, in particular in the area under which a cavity is located. The method also enables the manufacturing of a dielectric layer between silicon layer and substrate. The manufactured polysilicon SOI substrate includes a cavity below the silicon layer. A robust SOI wafer is generated, which has a mechanically insensitive edge. Costly and complex direct bonding methods are completely dispensed with. Simple adjustment concepts from standard semiconductor technology may be used, since a concealment of adjustment marks in the direct bonding method no longer takes place. A thin polysilicon layer is manufactured by the method according to the present invention, which has a mechanical breaking strength higher by a factor of two in comparison to monocrystalline silicon.

SOI wafers including substrate contacts may advantageously be manufactured by the method according to the present invention. A potential connection of the substrate from the wafer front side may thus be achieved in a simple manner. In addition, edge structures, such as diffusion stop structures, may be implemented at the chip edge. In addition, etch stop structures may be implemented at the edges of the cavity. It is possible to create stress-free suspensions of the thin silicon layer without oxide substructure. Finally, contact areas toward the substrate may be implemented, which may be used in the further course of the process as connections of functional elements of the thin silicon layer at vias (through silicon vias—TSV).

In one particularly advantageous embodiment of the method according to the present invention, the first polysilicon layer is polished using a CMP method and the second polysilicon layer is polished using an ion beam trimming method at low pressure. CMP methods have a high removal rate and produce very smooth surfaces. They are therefore particularly suitable for leveling the first layer, which is rather thick and is afflicted with a large amount of topography. Rather less topography results on the surface with the deposition of the second, rather thinner polysilicon layer and cavities are now present below the two polysilicon layers, which are under very low pressure. An ion polishing method which operates at very low pressure is therefore particularly suitable for leveling the surface. Methods which operate at high mechanical pressures such as a CMP method would press in locally above the cavities during the polishing of the two layers and generate a lesser removal locally there. This also applies to a somewhat lesser extent for polishing methods which do operate at lower contact pressure but at atmospheric pressure. The combination of a CMP method with an ion polishing method is therefore particularly advantageous in particular in combination with a first thick and a second thin polysilicon layer.

The layer thickness of the first polysilicon deposition is advantageously selected to be greater than the layer thickness of the second polysilicon deposition. In this way, the layer thickness of the new layer advantageously still remains very precisely defined.

The present invention also relates to a micromechanical device including a substrate, an insulation layer situated on the substrate, a first polysilicon layer situated on the insulation layer, and etching access trenches 15 in the first polysilicon layer. The micromechanical device according to the present invention includes a cavity in the substrate on the side oriented toward the first polysilicon layer, which is etched into the substrate below the etching access trenches. The etching access trenches are at least partially sealed using a second polysilicon layer.

Advantageous embodiments of the present invention may be inferred from the disclosure herein.

BRIEF DESCRIPTION OF THE DRAWINGS

FIGS. 1A through 1G show a method for manufacturing an SOI substrate including a cavity in the related art.

FIGS. 3A and 3B show an optional embodiment of the method according to the present invention for manufacturing a polysilicon SOI substrate including a cavity.

DETAILED DESCRIPTION OF EXAMPLE EMBODIMENT

FIGS. 1A through 1G show a method for manufacturing an SOI substrate including a cavity in the related art.

FIGS. 2A through 2J show a method according to the present invention for manufacturing an SOI substrate including a cavity in successive processing steps of the substrate.

Figure 1E:
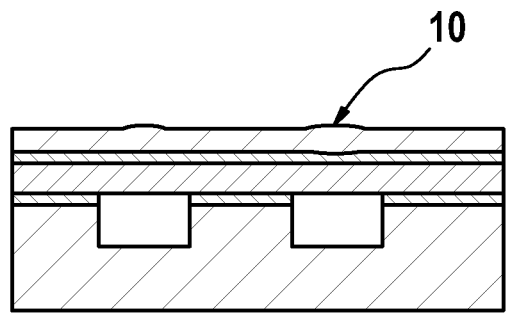
Figure 1F:
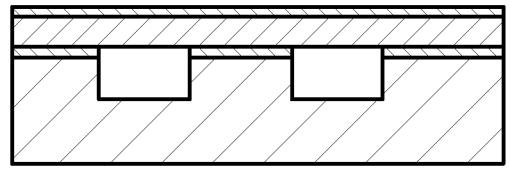
Figure 1G:
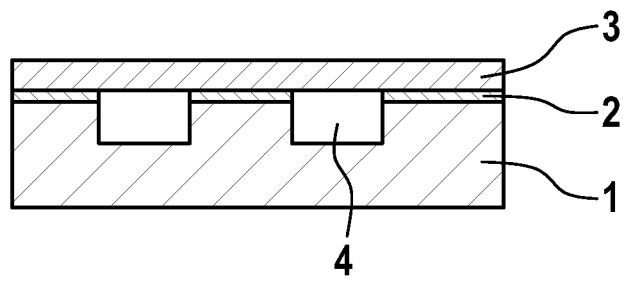
Figure 2A:
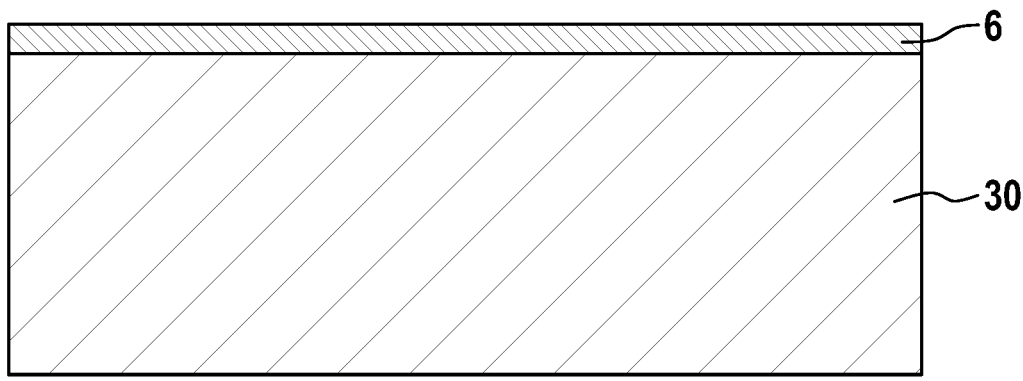
FIGS. 2A through 2J show a method according to an example embodiment of the present invention for manufacturing a polysilicon SOI substrate including a cavity in successive processing steps of the substrate.

A first oxide layer 6 is deposited or grown on a substrate 30, preferably on a monocrystalline silicon wafer (FIG. 2A). This first layer does not necessarily have to be an oxide layer according to the present invention, another dielectric layer such as a nitride or an oxynitride layer may also be used. An oxide layer is preferably grown via an oxidation process on the silicon wafer. Layers manufactured in this way have a very homogeneous oxide thickness and a very high quality.

Figure 2B:
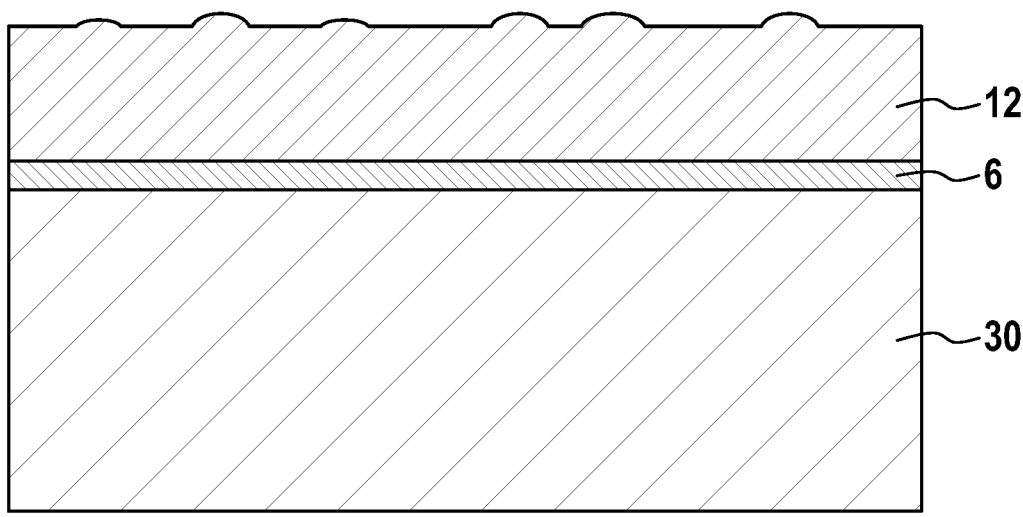
Figure 2C:
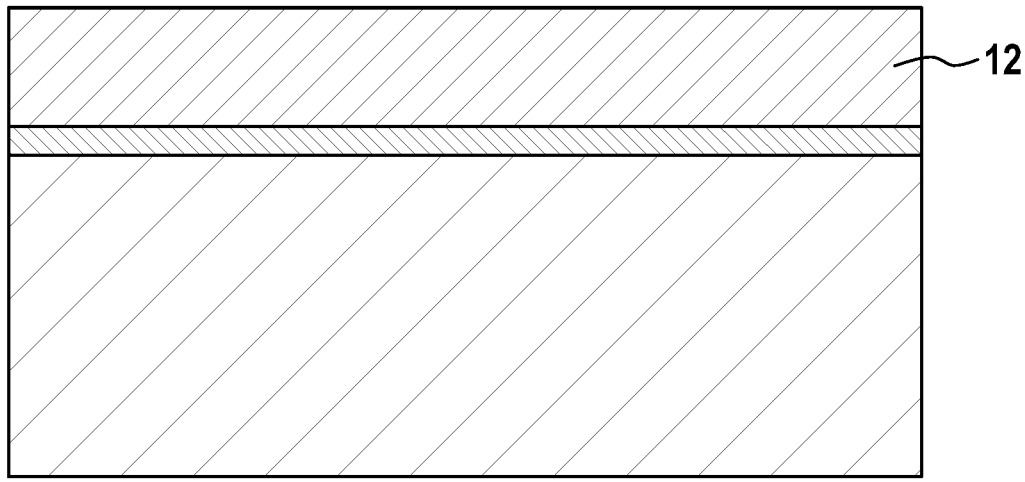

In the next step, a first polysilicon layer 12 is deposited. This may be an LPCVD deposition or a thin LPCVD deposition including a subsequent fast epitaxial poly-deposition (FIG. 2B).

In an optional step, which is advantageous in particular in the case of thick polysilicon layers (>5 μm), the polysilicon layer, which has a tendency to be rough, is planarized. This may be carried out by a CMP method or also by an ion trimmer. Because a cavity is not yet formed below the polysilicon layer in this method state, in particular thin polysilicon layers (thickness <40 μm) may be planarized very precisely (see FIG. 2C).

Figure 2D:
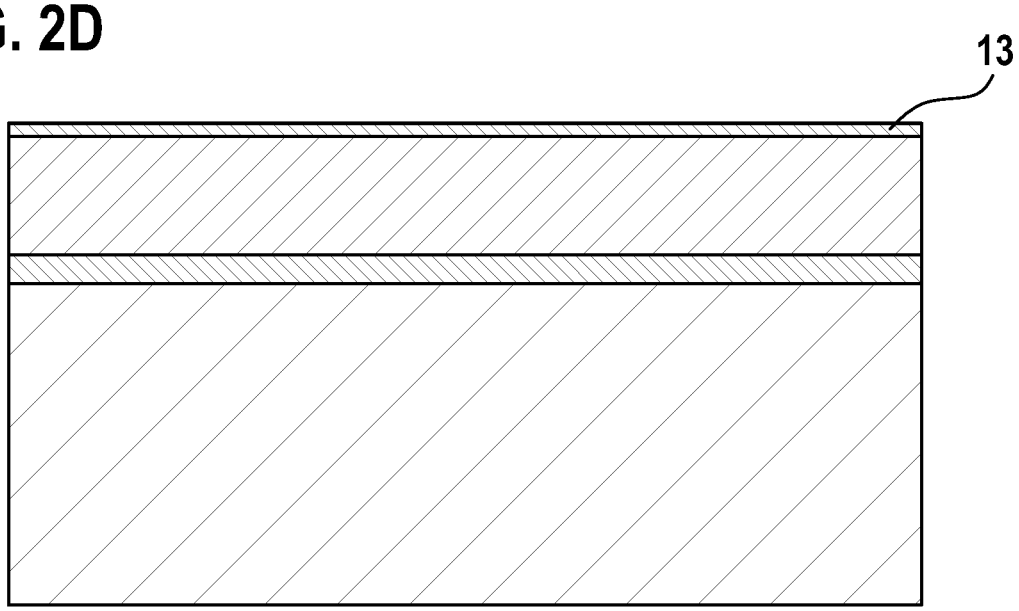

In a further step, a second oxide layer 13 is deposited or grown (see FIG. 2D). This second layer does not necessarily have to be an oxide layer according to the present invention, another layer may also be used, for example, a resist layer. This may be structured more easily than an oxide layer.

In a further step, second oxide layer 13 is structured. For this purpose, initially a mask 40 is applied to the second oxide layer. Narrow access openings 14 are introduced into the second oxide layer in the area which is later to be provided with a cavity. The width of the holes or trenches is significantly less than the target thickness of the polysilicon layer, in particular less than 3 μm.

Figure 2E:
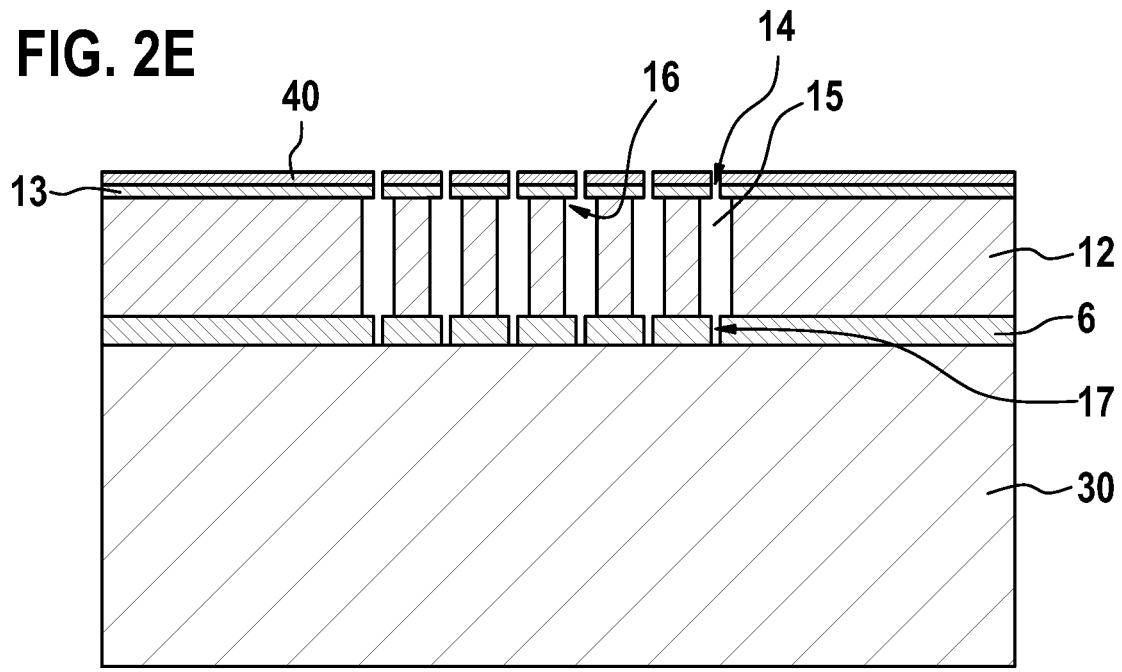
Figure 2F:
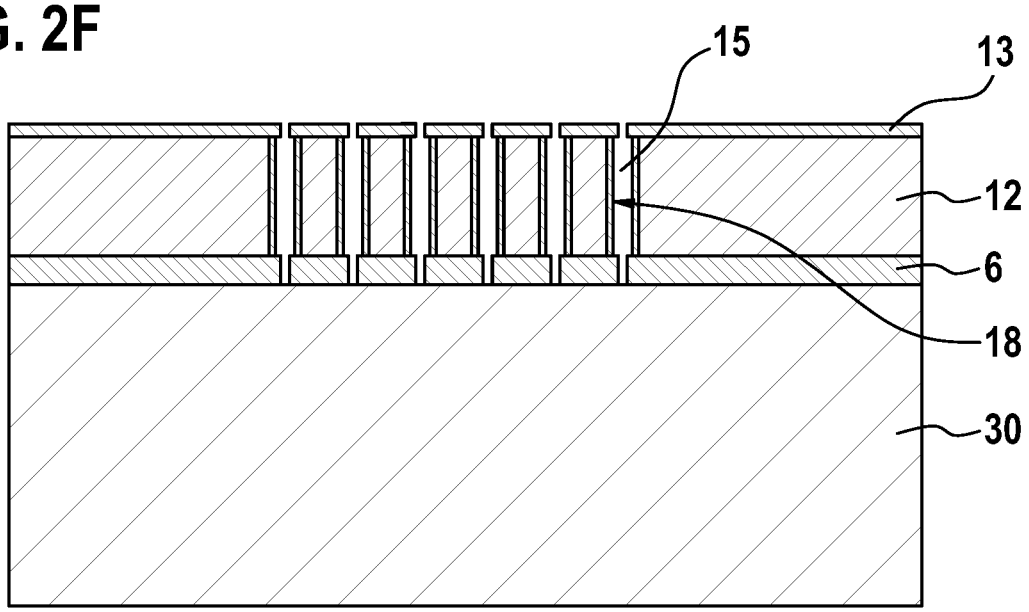
Figure 2G:
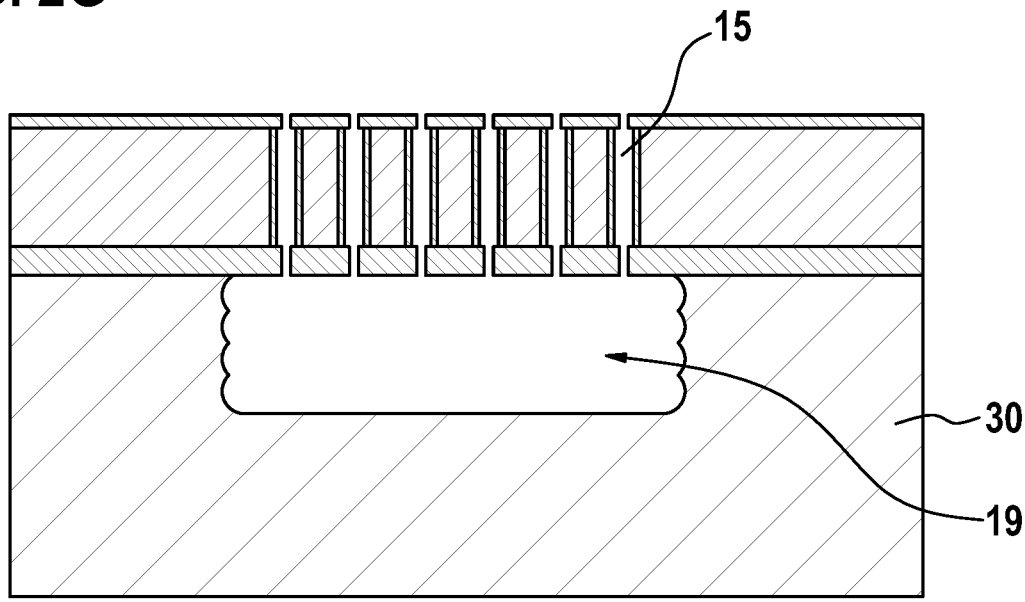

Trenches 15 are introduced into first polysilicon layer 13 by etching (see FIG. 2E). In particular, a trenching process is used which has a certain underetching 16 under the oxide layer on the polysilicon layer. In particular, a trenching process is used which underetches the oxide layer at least 20 nm.

Furthermore, first oxide layer 6 is removed under first polysilicon layer 12 at the base of trenches 15 using an anisotropic etching process 15, in particular a plasma-based etching process (see FIG. 2E).

Furthermore, a thin oxide 18 is grown or deposited. The oxide is deposited in particular on the side walls of trenches 15 in first polysilicon layer 12. In particular, a layer is deposited which is thicker than 10 nm and, on the other hand, is thinner than second oxide layer 13 on the surface of the first polysilicon layer (see FIG. 2F). This thin layer does not necessarily have to be an oxide layer according to the present invention, it may also be, for example, a layer deposited using a CF4-containing plasma.

In a further anisotropic etching step, thin oxide layer 18 is removed in trenches 15 at their bases, thus on substrate 30. The etching is carried out sufficiently briefly that the thick oxide on the surface of the polysilicon layer is not completely removed.

A cavity 19 is then generated using a trenching process having very strong underetching (see FIG. 2G) or isotropic silicon etching in substrate 30. The underetching in this etching step and the density of trenches 15 is selected in such a way that the entire area under the polysilicon layer in the substrate is underetched.

Figure 2H:
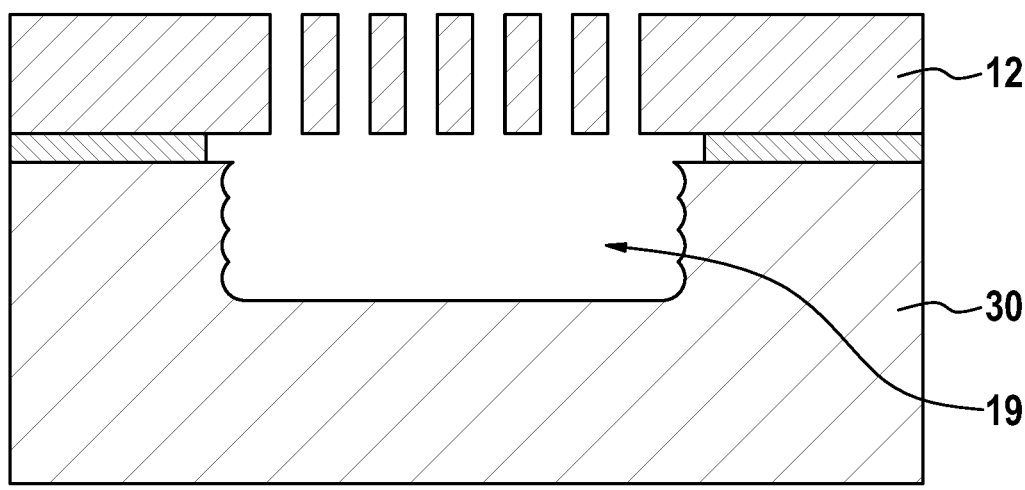
Figure 2I:
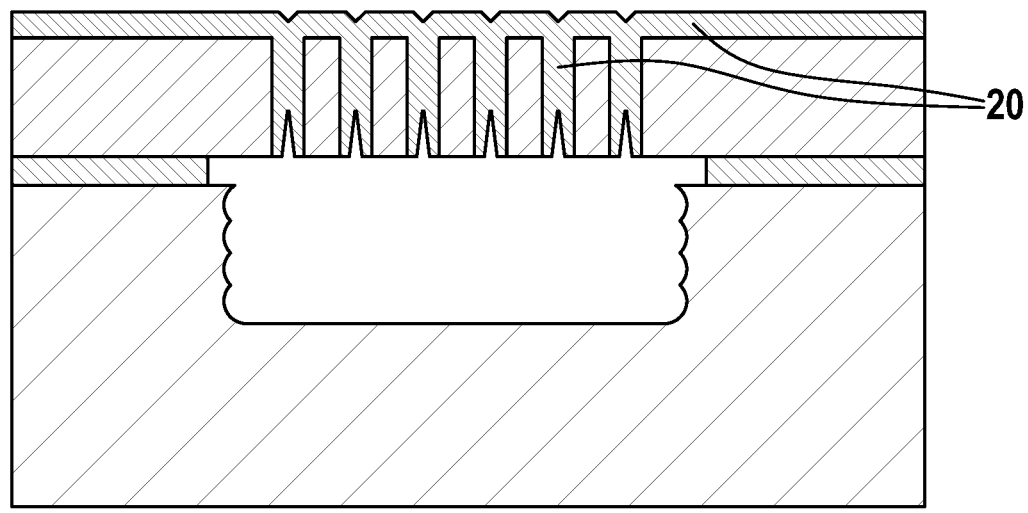
Figure 2J:
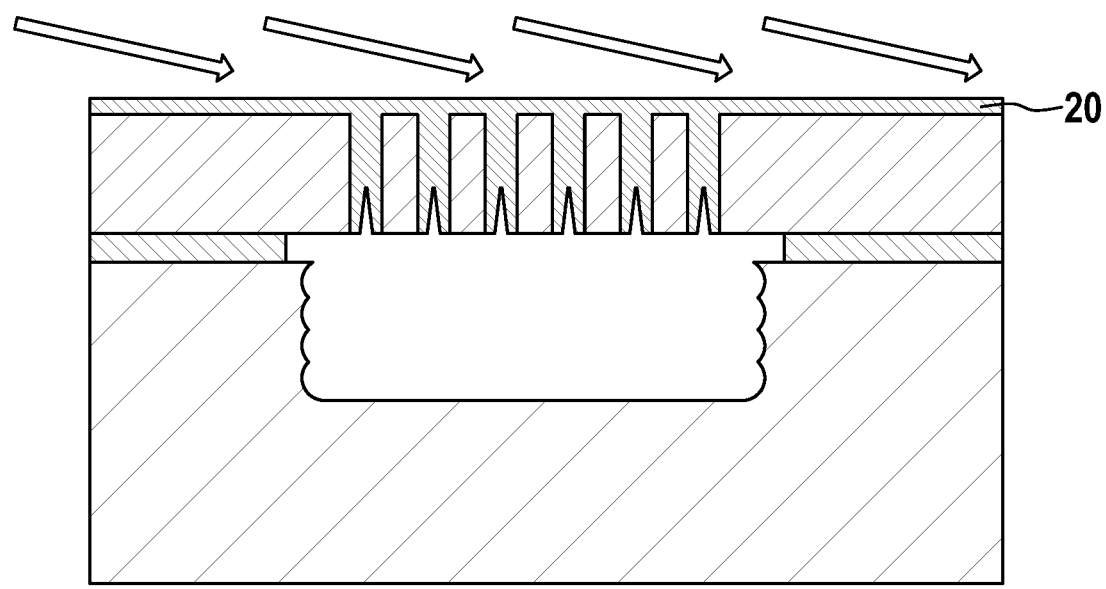

Furthermore, the oxide is removed in the area of cavity 19 in substrate 30 and on the surface of first polysilicon layer 12 using an isotropic etching method (for example, liquid HF or using gaseous HF) (see FIG. 2H).

In a further step, a second polysilicon layer 20 is preferably grown using an epitaxial method. The trench openings are thus closed. A layer 20 is preferably grown, the thickness of which is greater than half the layer thickness of first polysilicon layer 12. A layer 20 is preferably grown which is thinner than already present layer 12. The layer thickness of new layer 20 may thus still remain very precisely defined (see FIG. 2I).

In a further optional step, second polysilicon layer 20 may be planarized using an ion trimming method. It is advantageous that such methods may be carried out at pressures of less than 10 mbar, and the closure method of the cavity also generates very low pressures (>10 mbar) in the cavity. The polysilicon layer is thus not deflected during the planarization step and may be planarized very well (see FIG. 2J).

FIGS. 3A and B show an optional embodiment of the method according to the present invention for manufacturing a polysilicon SOI substrate including a cavity.

After the manufacture of the oxide layer (FIG. 2A), it may also be structured (FIG. 3A). Areas 11 thus opened are then filled using polysilicon (FIG. 3B). The open areas may be used later very well and in a simple manner as substrate contacts, in particular as substrate contacts for TSVs, or also, for example, as an etch stop layer during the gas phase etching. The substrate contacts may also be used to generate particularly tension-free suspensions toward the substrate, under which the oxides, which are usually very tension-filled, are not located.

Figure 4:
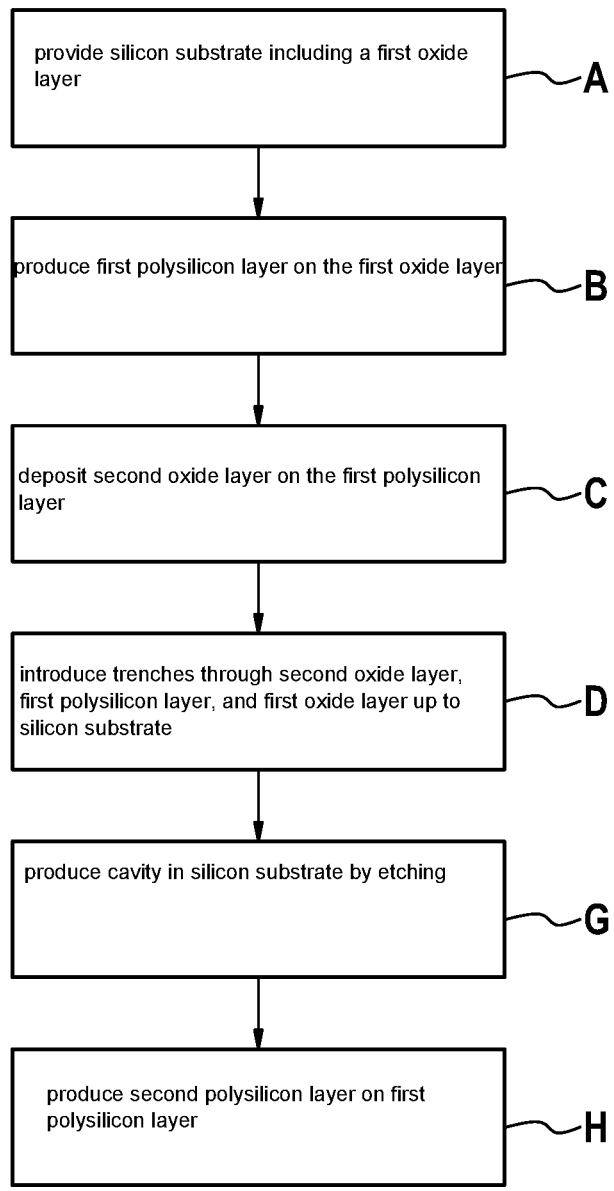
FIG. 4 schematically shows the example method according to the present invention for manufacturing a polysilicon SOI substrate including a cavity.

FIG. 4 schematically shows the method according to the present invention for manufacturing a polysilicon SOI substrate including a cavity.

The method includes the required steps:
A: providing a silicon substrate including a first oxide layer thereon;
B: producing a first polysilicon layer on the first oxide layer;
C: depositing a second oxide layer on the first polysilicon layer;
D: introducing trenches through the second oxide layer, the first polysilicon layer, and the first oxide layer up to the silicon substrate;
E: producing a thin oxide on the surfaces of the trenches, in particular on the first polysilicon layer;
F: removing the thin oxide at the base of the trenches;
G: producing a cavity in the silicon substrate by etching, an etching medium being conducted thereto through the trenches;
H: producing a second polysilicon layer on the first polysilicon layer, the trenches being thereby closed.

Figure 5:
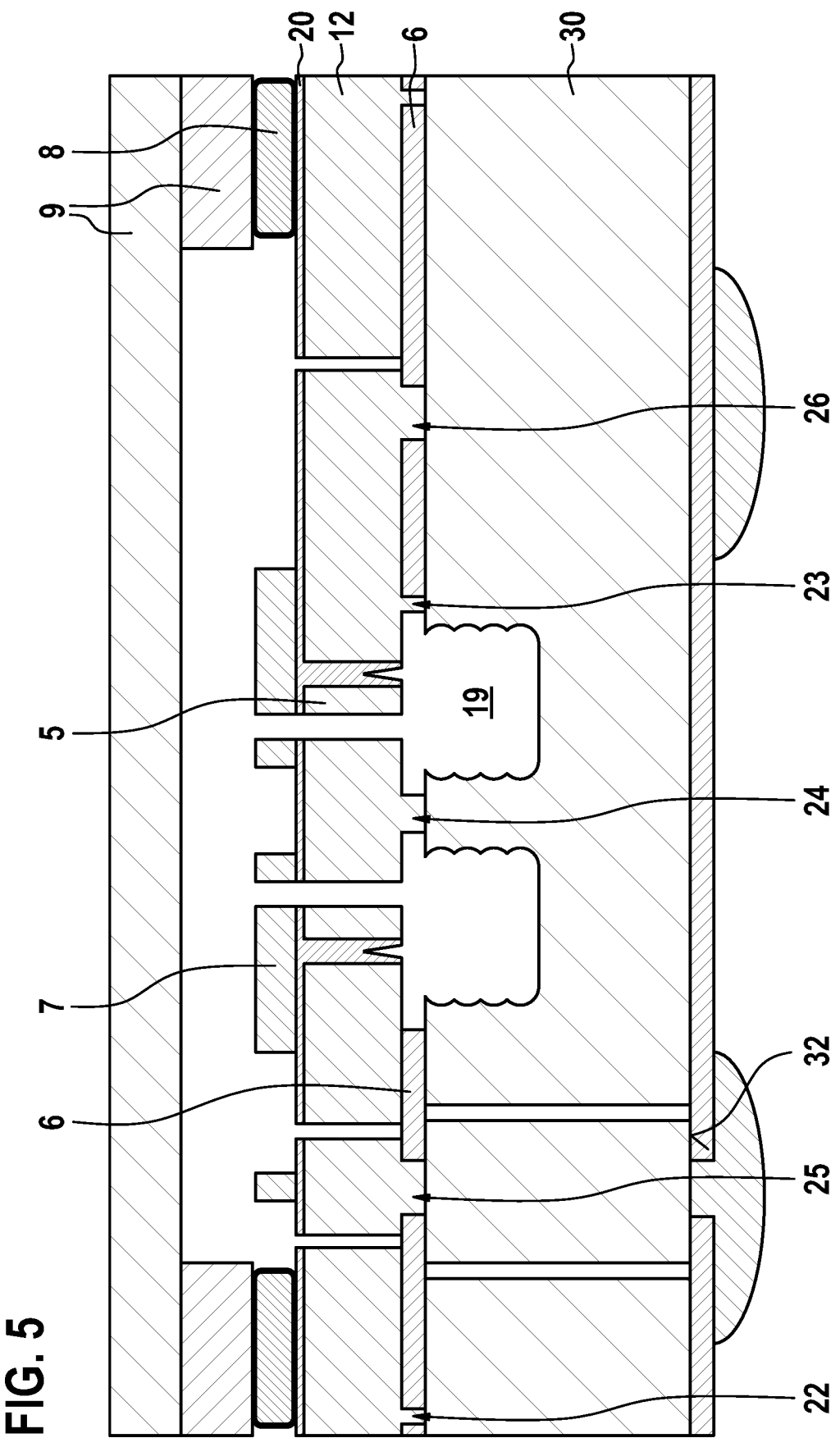
FIG. 5 schematically shows a micromechanical device manufactured using the method according to the present invention.

FIG. 5 schematically shows a micromechanical device manufactured using the method according to the present invention.

A device is shown including a silicon substrate 30, a cavity 19, a first oxide layer 6, a first polysilicon layer 12, and a second polysilicon layer 20. Further functional layers 7 are situated on second polysilicon layer 20. Cantilever structures 5 are formed in first and second polysilicon layer 12, 20. A cap substrate 9 is situated with the aid of a bonding frame 8 above second polysilicon layer 20 and connected thereto. In addition, a rear contact is schematically shown. The device additionally includes several direct connections between the first polysilicon layer and the silicon substrate. Using the method according to the present invention including opening the first oxide layer, devices including one or multiple such connections may be manufactured. A fifth direct connection 26 is shown between the substrate and the polysilicon layer in an area under which a cavity is not located. Substrate contacts may thus be generated in a simple manner from the wafer front side. Furthermore, a first direct connection 22 is shown between the substrate and the polysilicon layer in an edge area or in the bonding area. Edge structures, such as diffusion stop structures, may thus be implemented at the chip edge or below the bonding frame. A second direct connection 23 between the substrate and the polysilicon layer is situated in an area which borders a cavity. Etch stop structures may thus be implemented at the edges of the cavity. A third direct connection 24 is situated between the substrate and the polysilicon layer in an area which borders a cavity or is entirely or partially enclosed by a cavity. Stress-free suspensions of the thin silicon layer without oxide substructure may thus be implemented. A fourth direct connection 25 between the substrate and the polysilicon layer is situated in an area under which a cavity is not located. Contact areas may thus be implemented toward the substrate, which may be used in the further course of the process as connections of functional elements of the thin silicon layer at the TSV.

LIST OF REFERENCE NUMERALS 1 substrate
2 dielectric layer
3 thin monocrystalline silicon layer
4 cavity
5 cantilever structures
6 first oxide layer
7 further functional layers
8 bonding frame
9 cap wafer
10 thicker layer above cavity
12 first polysilicon layer
13 second oxide layer
14 narrow access openings
15 trenches
16 underetching
17 anisotropic etching process
18 thin oxide
19 cavity
20 second polysilicon layer
22 first direct connection
23 second direct connection
24 third direct connection
25 fourth direct connection
26 fifth direct connection
30 substrate
32 rear side
40 mask

What is claimed is:

1. A method for manufacturing a polysilicon SOI substrate including a cavity, comprising the following steps:
A) providing a silicon substrate including a sacrificial layer on the silicon layer;
B) producing a first polysilicon layer on the sacrificial layer;
C) depositing a structuring layer on the first polysilicon layer;
D) introducing trenches through the structuring layer, the first polysilicon layer, and the sacrificial layer up to the silicon substrate;
G) producing a cavity in the silicon substrate by etching, an etching medium being conducted thereto through the trenches;

H) producing a second polysilicon layer on the first polysilicon layer to close the trenches, wherein after step B, the first polysilicon layer is planarized by CMP and/or an ion trimming method.

2. The method for manufacturing a polysilicon SOI substrate including a cavity as recited in claim 1, further comprising the following steps:

E) producing a thin oxide on surfaces of the trenches, on the first polysilicon layer;

F) removing the thin oxide at a base of the trenches;

wherein step E is carried out after step D and step F is carried out prior to step G.

3. The method for manufacturing a polysilicon SOI substrate including a cavity as recited in claim 1, wherein the sacrificial layer is a first silicon oxide layer.

4. The method for manufacturing a polysilicon SOI substrate including a cavity as recited in claim 1, wherein the structuring layer is a second silicon oxide layer.

5. The method for manufacturing a polysilicon SOI substrate including a cavity as recited in claim 1, wherein the sacrificial layer is an insulation layer.

6. The method for manufacturing a polysilicon SOI substrate including a cavity as recited in claim 1, wherein the cavity is positioned below the trenches.

7. The method for manufacturing a polysilicon SOI substrate including a cavity as recited in claim 1, wherein a direct electrical connection is formed between the first polysilicon layer and the substrate.

8. The method for manufacturing a polysilicon SOI substrate including a cavity as recited in claim 1, wherein the direct electrical connection is formed between the first polysilicon layer and the substrate up to a rear side of the substrate, opposite a side of the substrate at which the sacrificial layer is located.

9. A method for manufacturing a polysilicon SOI substrate including a cavity, comprising the following steps:

A) providing a silicon substrate including a sacrificial layer on the silicon layer;

B) producing a first polysilicon layer on the sacrificial layer;

C) depositing a structuring layer on the first polysilicon layer;

D) introducing trenches through the structuring layer, the first polysilicon layer, and the sacrificial layer up to the silicon substrate;

G) producing a cavity in the silicon substrate by etching, an etching medium being conducted thereto through the trenches;

H) producing a second polysilicon layer on the first polysilicon layer to close the trenches, wherein after step H, the second polysilicon layer is planarized using an ion trimming method.

* * * * *